(12) United States Patent
Wright et al.

(10) Patent No.: US 8,082,373 B2
(45) Date of Patent: Dec. 20, 2011

(54) SPECIALIZED UNIVERSAL SERIAL BUS CONTROLLER

(75) Inventors: David Wright, San Diego, CA (US); Steve Kolokowsky, San Diego, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 41 days.

(21) Appl. No.: 11/857,970

(22) Filed: Sep. 19, 2007

(65) Prior Publication Data

US 2008/0263243 A1 Oct. 23, 2008

Related U.S. Application Data

(60) Provisional application No. 60/912,577, filed on Apr. 18, 2007.

(51) Int. Cl.
*G06F 3/00* (2006.01)
(52) U.S. Cl. .............................................. 710/30; 710/6
(58) Field of Classification Search ................. 710/30, 710/6
See application file for complete search history.

(56) References Cited

U.S. PATENT DOCUMENTS

| | | | | |
|---|---|---|---|---|
| 5,845,151 A * | 12/1998 | Story et al. | ....... | 710/27 |
| 6,219,736 B1 * | 4/2001 | Klingman | ....... | 710/315 |
| 6,266,715 B1 * | 7/2001 | Loyer et al. | ....... | 710/22 |
| 6,357,011 B2 * | 3/2002 | Gilbert | ....... | 713/300 |
| 6,407,641 B1 * | 6/2002 | Williams et al. | ....... | 331/1 A |
| 6,708,233 B1 * | 3/2004 | Fuller et al. | ....... | 710/22 |
| 6,708,247 B1 * | 3/2004 | Barret et al. | ....... | 710/313 |
| 7,600,156 B2 * | 10/2009 | Thornley et al. | ....... | 714/43 |
| 7,631,111 B2 * | 12/2009 | Monks et al. | ....... | 710/15 |
| 2002/0116565 A1 * | 8/2002 | Wang et al. | ....... | 710/313 |
| 2003/0094924 A1 * | 5/2003 | Oh | ....... | 320/128 |
| 2006/0033474 A1 | 2/2006 | Shum | | |
| 2007/0029975 A1 | 2/2007 | Martin et al. | | |

FOREIGN PATENT DOCUMENTS

EP 1 625 506 B1 * 12/2004

OTHER PUBLICATIONS

USB Complete $3^{rd}$ Ed. Jan Axelson.*
U.S. Patent and Trademark Office; PCT International Search Report; Sep. 3, 2008; 2 Pages.

* cited by examiner

*Primary Examiner* — Henry Tsai
*Assistant Examiner* — Eric Oberly

(57) ABSTRACT

A universal serial bus controller pre-generates and stores a subset of USB commands in a memory, the pre-generated commands available for transmission to at least one USB peripheral device over universal serial bus, and transfers at least one command from the subset of pre-generated commands stored in the memory to the USB peripheral device over the universal serial bus. The universal serial bus controller may receive a response to the transferred command from the USB peripheral device over the universal serial bus, and send an acknowledgment packet to the USB peripheral device over the universal serial bus responsive to receiving the response from the USB peripheral device.

22 Claims, 4 Drawing Sheets

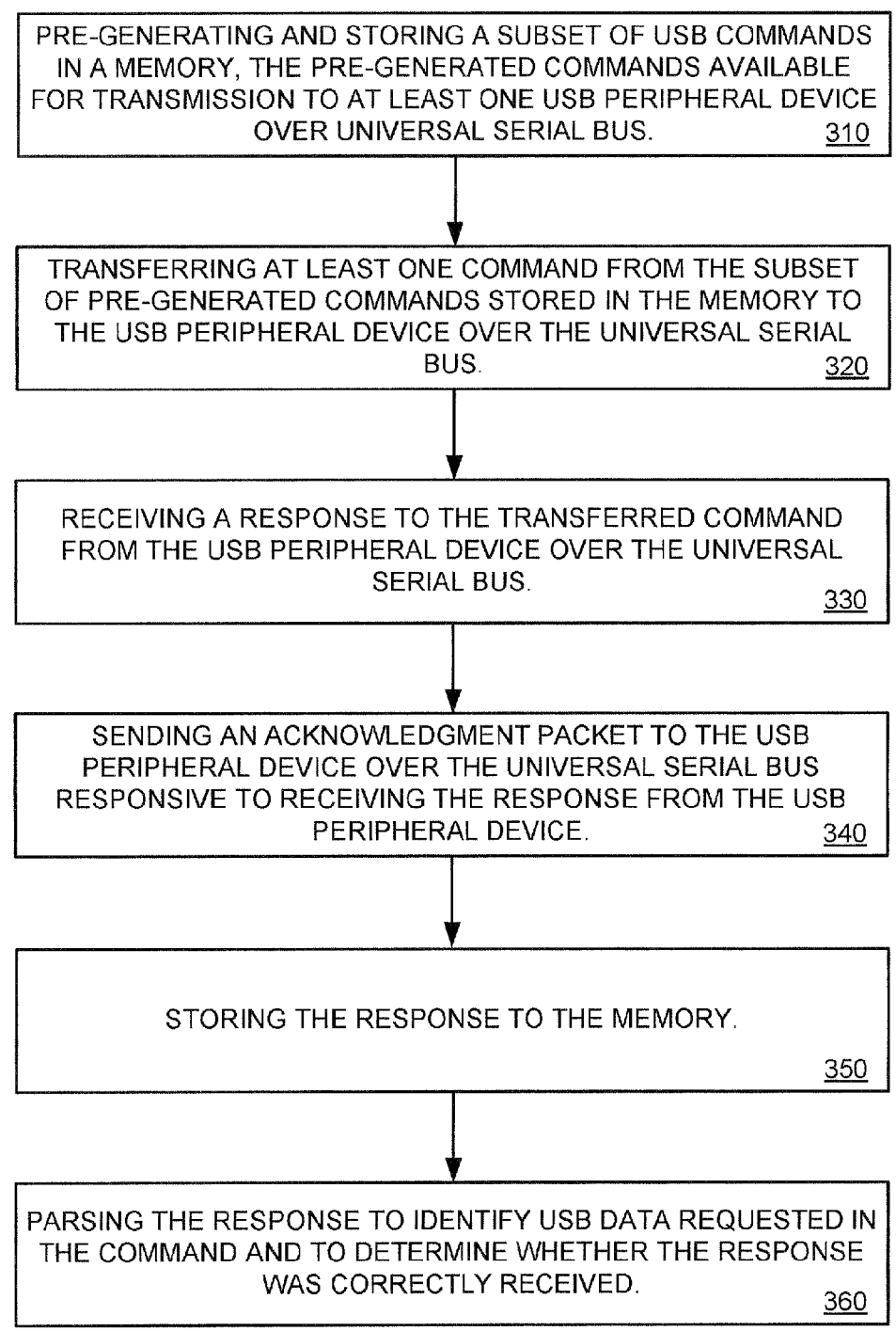

SPECIALIZED UNIVERSAL SERIAL BUS CONTROLLER

RELATED APPLICATIONS

This application claims priority from U.S. Provisional Application No. 60/912,577, filed Apr. 18, 2007, which is incorporated herein by reference.

FIELD OF THE INVENTION

The present disclosure relates generally to Universal Serial Bus (USB) applications, and more particularly to specialized USB controllers.

BACKGROUND

The Universal Serial Bus (USB) specification describes a uniform data transmission protocol for use when transmitting data over a Universal Serial Bus. When fully compliant, USB controllers conform to the USB specification by implementing all of the functionality described by the USB specification. Although the use of fully compliant USB controllers is attractive because they can perform any activity described in USB specification, they may be complex and their incorporation into many USB hosts may be costly and an inefficient use of system resources. Thus the ability to do anything described in USB specification comes at the cost of being able to do a few simple things efficiently.

DESCRIPTION OF THE DRAWINGS

The invention may be best understood by reading the disclosure with reference to the drawings.

FIG. 3 is an example flowchart of the universal serial bus host systems shown in FIGS. 1A and 1B.

DETAILED DESCRIPTION

Figure 1A:
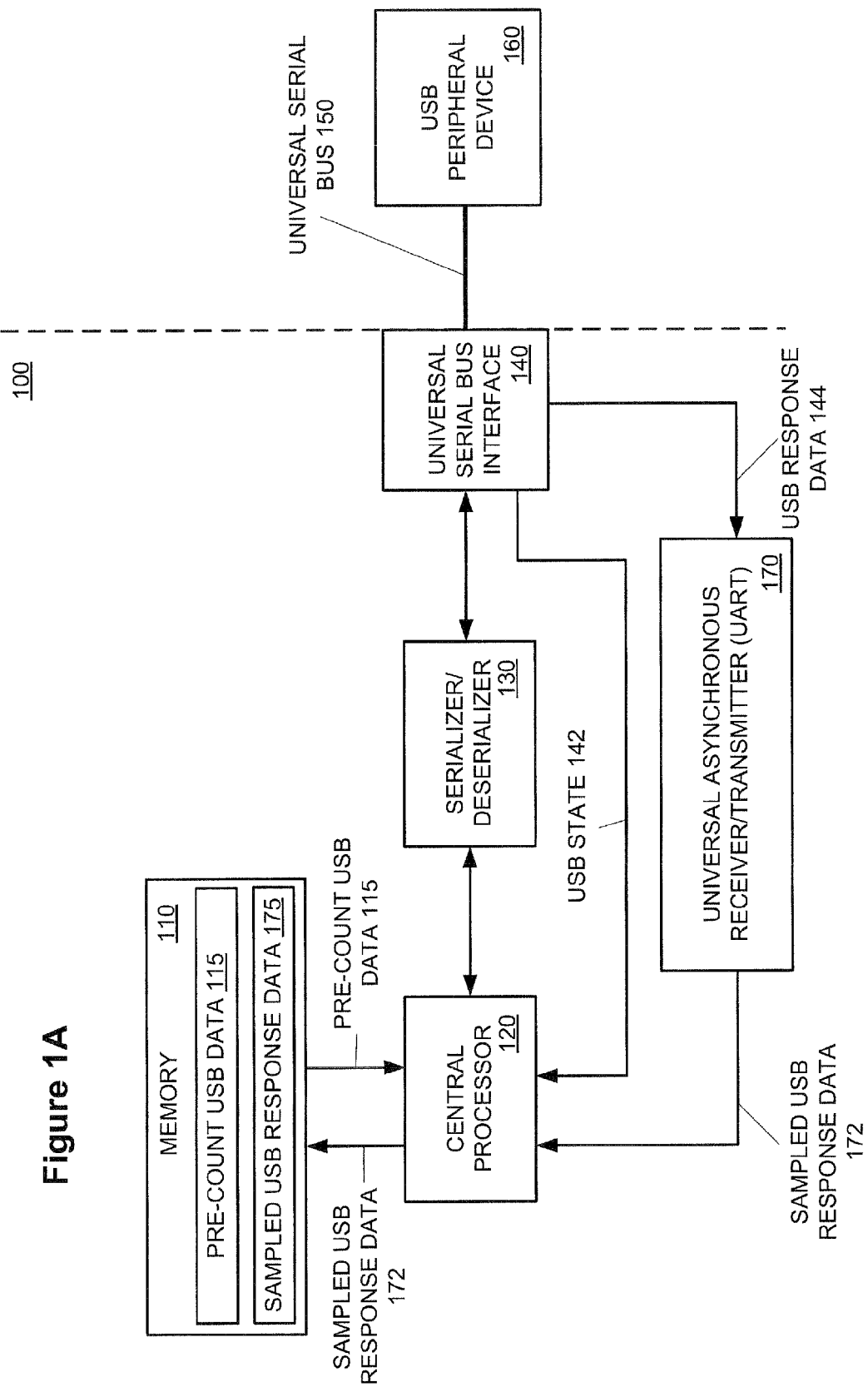
FIGS. 1A and 1B are block diagrams of universal serial bus host systems according to embodiments of the invention.
Figure 1B:
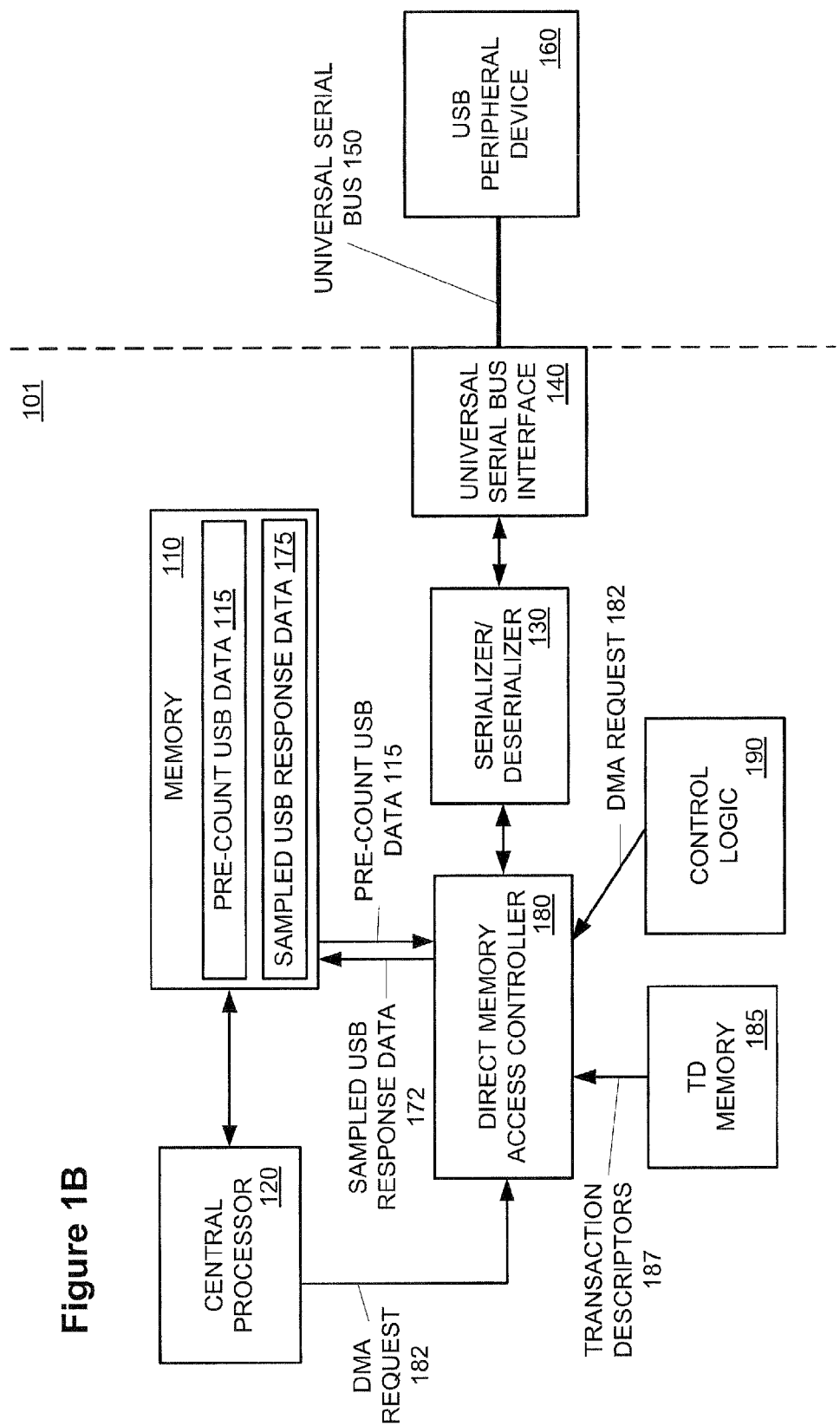

FIGS. 1A and 1B are block diagrams of universal serial bus host systems 100 according to embodiments of the invention. Referring to FIG. 1A, a universal serial bus (USB) host system 100 is coupled to a USB peripheral device 160 via a universal serial bus 150. The USB host system 100 includes a central processor 120 to control the communication with the USB peripheral device 160 for the USB host system 100. For instance, the central processor 120 may direct the USB host system 100 to issue requests over the USB 150, synchronize with incoming data from the USB 150 by tracking synchronization bits in the incoming data, decode the incoming data, determine whether the incoming data was received correctly, and respond to the incoming data when necessary.

USB host system 100 may be a reduced functionality USB host controller, capable of performing a set of one or more preprogrammed functions from the USB specification. For instance, when the USB host system 100 is incorporated into a host device, such as a battery charger, the USB host system 100 may include functionality that allows the host device to charge the battery of a USB peripheral device 160 (such as a cellphone, PDA, etc) via the USB 150. The inclusion of a fully compliant USB host controller into a host device that only intends to utilize the USB 150 to perform charging operations can be expensive and unnecessarily complex.

The USB host system 100 includes a memory 110 to store pre-generated USB data 115 for use in transmissions over the USB 150 to the USB peripheral device 160. This pre-generated USB data 115 may be generated and stored in memory 110 by the central processor 120 or by another device internal to or external from the USB host system 100. As will be described below in greater detail, the pre-generated USB data 115 may have a format that allows the USB host system 100 to transfer the pre-generated USB data 115 from the memory 110 to the USB 150 without having to perform alterations on the pre-generated USB data 115.

The USB host system 100 includes a universal serial bus physical interface ("phy") 140 to couple to the USB 150. The universal serial bus interface 140 may identify when a peripheral device 160 is coupled to the USB host system 100 via the USB 150 and provide a USB state 142 to the central processor 120 that indicates the peripheral device 160 is coupled to the USB host system 100 via the USB 150. The USB 150 may have at least 3 states: a J state, a K state, and a single-ended 0 (SE0) state. The J state may correspond to a 3 v-0 v condition across the two-wire pair associated with the USB 150. The K state may correspond to a 0 v-3 v condition across the two-wire pair associated with the USB 150. The SE0 state may correspond to a 0 v-0 v condition across the two-wire pair associated with the USB 150. The universal serial bus interface 140 may identify when a peripheral device 160 is coupled to the USB host system 100 according to the presence of one of these USB states, or from transitions in the USB states.

The central processor 120 may receive pre-generated USB data 115 from the memory 110, e.g., responsive to the USB state 142, and direct the USB host system 100 to provide the pre-generated USB data 115 on the USB 150. In some embodiments, the pre-generated USB data 115 may be a request for the peripheral device 160, or may be an acknowledgement of USB response data 144 received from the peripheral USB device 160. The pre-generated USB data 115 may be a complete bit sequence or substantially complete bit sequence that is available for transmission over the USB 150. For instance, when the pre-generated USB data 115 is a complete bit sequence, the USB host system 100 may directly retrieve the pre-generated USB data 115 from memory 110 and send it over the USB 150 without having to perform additional processing on the data. When the pre-generated USB data 115 is a substantially complete bit sequence, the USB host system 100 may directly retrieve the pre-generated USB data 115 from memory 110 and send it over the USB 150 with little additional processing, such as appending a preamble, etc.

In some embodiments, the USB host system 100 may send the USB peripheral device 160 at least one pre-generated command that is configured to instruct the USB peripheral device 160 to enable battery charging the USB peripheral device 160 may charge a battery with power received from the USB host system 100 over the USB 150 responsive to the sent command. The USB host system 100 may determine to send the pre-generated command to the USB peripheral device 160 when the USB host system 100 detects certain pre-defined characteristics of the USB peripheral device 160. For instance, the USB host system 100 may detect that the USB peripheral device 160 only connects to the USB host system 100 to charge one or more batteries, and thus does not require a fully-compliant USB host. In other embodiments, the USB host system 100 may detect that the USB peripheral device 160 does not require USB functionality that the USB host system 100 does not support, and therefore send the USB peripheral device 160 the pre-generated command.

The USB host system 100 includes a serializer/deserializer 130 to perform serialization operations on outgoing data and deserialization operations on data incoming from the USB 150. The USB host system 100 may also includes a universal asynchronous receiver and transmitter (UART) 170 to sample USB response data 144 from the peripheral USB device 160. In some embodiments, the central processor 120 or other device in the USB host system 100 may sample USB response data 144 from the peripheral USB device 160. The UART 170 may over-sample the USB response data 144, for example using a 4 times over-sampling process, to recover the response and to generate sampled USB response data 172. The UART 170 may provide the sampled USB response data 172 to the central processor 120 via the serializer/deserializer 130 for storage and processing. Embodiments of the operation of the USB host system 100 will be described below in greater detail.

When the central processor 120 receives the USB state 142 indicating that a USB peripheral device 160 is coupled to the USB host system 100, the central processor 120 may retrieve a pre-generated Get_Device_Descriptor request, which is a standard USB request, from the memory 110. Once the pre-generated Get_Device_Descriptor request is provided to the peripheral USB device 160 over the USB 150, the peripheral USB device 160 may generate a response to the pre-generated Get_Device_Descriptor request. The response may include a device descriptor that describes the type of device coupled to the USB host system 100 via the USB 150.

The USB host system 100 may receive the response at the universal serial bus interface 140 as USB response data 144 and provide the USB response data 144 to the UART 170. The UART 170 may sample the USB response data 144 and provide the sampled USB response data 172 to the central processor 120 via the serializer/deserializer 130 for storage and/or processing. In some embodiments, the UART 170 may over-sample the USB response data 144, for example, using a 4 times over-sampling process, to generate sampled USB response data 172.

The central processor 120 may direct the USB host system 100 to provide an acknowledgement to the response from the peripheral USB device 160. The acknowledgement may be stored in the memory 110 as pre-generated USB data 115, which is retrieved responsive to the reception of the response from the peripheral USB device 160. In some embodiments, the acknowledgement is sent to the peripheral USB device 160 over the USB 150 prior to the central processor 120 parsing the response to identify the device descriptor.

The central processor 120 may store the sampled USB response data 172 in the memory 110, and then subsequently retrieve the sampled USB response data 172 for processing. The central processor 120 may parse the sampled USB response data 172 to determine whether the USB response data 144 was correctly received by the USB host system 100. For instance, the central processor 120 may perform a cyclical redundancy check (CRC) and compare the results of the CRC to the contents of a CRC field in the USB response data 144. Embodiments of this USB host system-to-peripheral device interaction will be described later in greater detail.

Referring to FIG. 1B, the USB host system 101 is similar to the USB host system 100 shown and described in FIG. 1A with the following differences. The USB host system 101 includes a direct memory access controller 180 to perform direct memory access (DMA) operations on data in the memory 110. The direct memory access controller 180 may perform DMA operations responsive to DMA requests 182 from the central processor 120 or from other control logic 190.

For instance, the direct memory access controller 180 may retrieve pre-generated USB data 115 from the memory 100 to the USB 150, via the USB 150 via the serializer/deserializer 130 and the universal serial bus interface 140. The direct memory access controller 180 may also directly store data received from the USB 150 to the memory 110 for subsequent parsing by the central processor 120. Both of these DMA operations may be performed without involving the central processor 120, thus eliminating the need for the central processor 120 to be involved in any real-time aspects of the USB host system 101 control.

The USB host system 101 includes a TD memory 185 to store transaction descriptors 187 used in performing DMA operations. For instance, the direct memory access controller 180 may receive a DMA request 182 from either the central processor 120 or the control logic 190 that prompts the direct memory access controller 180 to receive a transaction descriptor 187 from the TD memory. The direct memory access controller 180 may perform the DMA operations according to the transaction descriptors 187 received from the TD memory 185.

Figure 2:
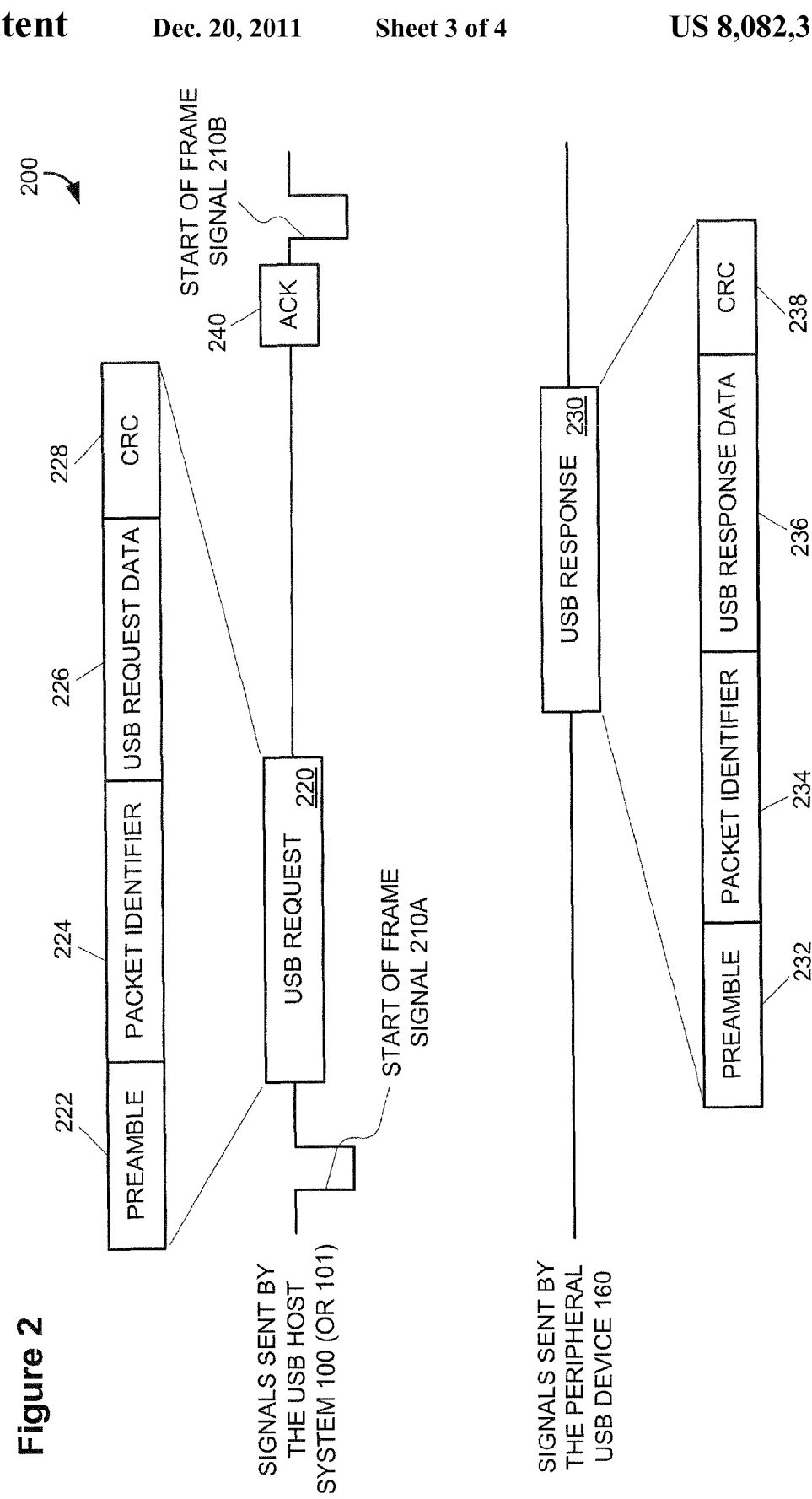
FIG. 2 is a flow diagram illustrating embodiments of the pre-generated USB signaling 200 described with reference to FIGS. 1A and 1B.

FIG. 2 is a flow diagram illustrating embodiments of the pre-generated USB signaling 200 described with reference to FIGS. 1A and 1B. Referring to FIG. 2, the pre-generated USB signaling 200 includes a plurality of start of frame signals 210A and 210B to denote a packet frame associated with the USB 150. For instance, the USB host systems 100 and 101 may generate or retrieve from memory 110 the start of frame signals 210A and 210B to indicate the beginning of a new packet frame for the USB 150. In some embodiments, the timing between these signals may be 1 millisecond.

After the start of frame signal 210A is provided to the USB 150 by the USB host system 100 or 101, the USB host system 100 or 101 may provide a USB request 220 to the USB 150. The USB request 220 may be pre-generated data 115 stored in memory 110 that is transferred to the USB 150 during a central processor transfer operation or a DMA operation.

The USB request 220 may be a standard or vendor USB request with the following fields: a preamble field 222, a packet identifier field 224, a USB request data field 226, and a CRC field 228. The preamble field 222 may indicate the USB request 220 conforms to the USB specification. The packet identifier field 224 may identify the packet type, such as a standard or vender request, and indicate whether the USB request 220 is a data-in, data-out, or set-up packet. The USB request data field 226 includes the data to be transferred to the peripheral USB device 160 over the USB 150. The CRC field 228 is for use by the peripheral USB device 160 to determine whether the USB request 220 was received correctly, or that no bits were lost during transfer over the USB 150.

After the peripheral USB device 160 receives the USB request 220 over the USB 150, the peripheral USB device 160 may provide a USB response 230 to the USB request 220. The peripheral USB device 160 may provide the USB response 230 when the USB 150 is in an idle state, such as when there has not been state switching for a predetermined period of time after the transmission of the USB request 220.

The USB response 230 may have a similar format to the USB request 220, with a preamble field 232, a packet identifier field 234, a USB response data field 236, and a CRC field 238. The preamble field 232 may indicate the USB response 230 conforms to the USB specification. The packet identifier field 234 may identify the packet type, such as the type of response, and indicate whether the USB response 230 is a data-in, data-out, or set-up packet. The USB response data field 236 includes the data to be transferred to the USB host system 100 or 101 over the USB 150. The CRC field 238 is for use by the USB host system 100 or 101 to determine whether the USB response 230 was received correctly, or that no bits were lost during transfer over the USB 150.

Upon reception of the USB response 230, the USB host system 100 or 101 provides an acknowledgement ACK 240 over the USB 150. The acknowledgement ACK 240 may be pre-generated data 115 stored in memory 110 that is transferred to the USB 150 during a central processor transfer operation or a DMA operation. The USB host system 100 or 101 may provide the acknowledgement ACK 240 when the USB 150 is in an idle state, such as when there has not been state switching for a predetermined period of time after the transmission of the USB response 230. In some embodiments, the USB host system 100 or 101 may automatically send the acknowledgment ACK 240 after receiving the USB response 230 without having first processed or parsed the USB response 230 to determine if it was correctly received. This automatic transmission of the acknowledgement ACK 240 allows the USB host systems 100 and 101 to implement USB host functionality without dedicated hardware to process USB packets in "real-time" as required in conventional systems.

FIG. 3 is an example flowchart of the universal serial bus host systems shown in FIGS. 1A and 1B. Referring to FIG. 3, in a block 310, the USB host system 100 or 101 pre-generates and stores a subset of USB commands 115 in a memory 110, the pre-generated commands 115 available for transmission to at least one USB peripheral device 160 over universal serial bus 150. The central processor 120 may pre-generate the USB commands or pre-generated USB data 115 and store the commands in the memory 110. In some embodiments, the memory 110 may be pre-programmed with the pre-generated USB data 115 according to the functionality that the USB host system 100 or 101 intends to supply via the USB 150.

In a block 320, the USB host system 100 or 101 transfers at least one command from the subset of pre-generated commands 115 stored in the memory 110 to the USB peripheral device 160 over the universal serial bus 150. The USB host system 100 or 101 may be configured to have the central processor 120 to perform transfers of pre-generated USB data 115 to the USB 150, or include a direct memory access controller 180 to directly access the memory 110 and provide the pre-generated USB data 115 to the USB 150. The direct memory access controller 180 may perform the DMA operations on the pre-generated USB data 115 without having to involve the central processor 120.

In a block 330, the USB host system 100 or 101 receives a response to the transferred command from the USB peripheral device 160 over the universal serial bus 150. The response may be sampled or over-sampled by the USB host system 100 or 101 as it is received from the USB 150.

In a block 340, the USB host system 100 or 101 sends an acknowledgment packet ACK to the USB peripheral device 160 over the universal serial bus 150 responsive to receiving the response from the USB peripheral device 160. The acknowledgement ACK may indicate that a non-corrupted response was received by the USB host system 100 or 101 regardless of whether the USB host system 100 or 101 processed the response to determine if it was corrupted during transmission. In other words, the USB host system 100 or 101 may send the acknowledgement ACK directing the peripheral device 160 to not resend the response, even when a corrupted response is received.

In a block 350, the USB host system 100 or 101 stores the response to the memory 110. The USB host system 100 or 101 may be configured to have the central processor 120 to transfer the response to the memory 110, or include a direct memory access controller 180 to directly provide the response to the memory 110. The direct memory access controller 180 may perform the DMA operations on the response without having to involve the central processor 120.

In a block 360, the USB host system 100 or 101 parses the response to identify USB data requested in the command and to determine whether the response was correctly received in some embodiments, the central processor 120 may perform the parsing of the response when it is not busy performing other processing tasks for the USB host system 100 or 101.

Since many applications for USB host systems that a full Host implementation would include USB functionality that would never be used, the selective removal of this non-usable USB functionality allows USB hosts systems to have a reduced size and cost without de facto reduced USB functionality. Some of these reduced-functionality USB host systems may pre-generate their USB commands, instead of generating them on-the-fly, allows for the removal of dedicated USB host controller hardware from these reduced-functionality USB host systems. By acknowledging every packet received from the USB regardless of whether it was corrupted during transmission, allows these reduced-functionality USB host systems to further defray processing until a time more convenient to its processing center(s). Further, an incorporation of DMA functionality between the USB and memory allows the reduced-functionality USB host systems to quickly and efficiently transfer pre-generated data to the USB and store data from the USB to the memory without involving the central processor.

One of skill in the art will recognize that the concepts taught herein can be tailored to a particular application in many other advantageous ways. In particular, those skilled in the art will recognize that the illustrated embodiments are but one of many alternative implementations that will become apparent upon reading this disclosure.

The preceding embodiments are exemplary. Although the specification may refer to "an", "one", "another", or "some" embodiment(s) in several locations, this does not necessarily mean that each such reference is to the same embodiment(s), or that the feature only applies to a single embodiment.

What is claimed is:

1. A method comprising:
preparing a pre-generated Universal Serial Bus (USB) request associated with a functional characteristic of a USB peripheral device, the pre-generated USB request compromising a packet identifier, request data, and a cyclic redundancy check value; and
after storing the pre-generated USB request in a host memory:
detecting by a USB host, a functional characteristic of the USB peripheral device corresponding to the request data of the pre-generated USB request; and
based on the detection, accessing the host memory to transmit the pre-generated USB request to the USB peripheral device over the USB.

2. The method of claim 1, further comprising:
preparing a pre-generated acknowledgment packet that corresponds to the pre-generated USB request;
storing in the host memory the acknowledgment packet;
receiving from the USB peripheral device, over the USB, a response to the pre-generated USB request; and after parsing the response, automatically sending the acknowledgment packet to the USB peripheral device over the USB responsive to the parsing of the response.

3. The method of claim 1, further comprising:
preparing a pre-generated acknowledgment packet that corresponds to the pre-generated USB request;
storing in the host memory the acknowledgment packet;
receiving from the USB peripheral device, over the USB, a response to the pre-generated USB request; and
prior to parsing the response, automatically sending the acknowledgment packet to the USB peripheral device over the USB, responsive to receiving the response.

4. The method of claim 3, further comprising:
storing the response in the host memory; and
parsing the response to determine whether the response was correctly received without error.

5. The method of claim 3, wherein the storing of the response comprises performing one or more direct memory access operations to directly transfer the response to the host memory.

6. The method of claim 3, further comprising:
recovering the received response by oversampling a received version of the received response; and
storing the recovered version of the received response in the host memory.

7. The method of claim 1, wherein the accessing of the host memory to transmit the pre-generated USB request includes performing one or more direct memory access operations to retrieve the pre-generated USB request.

8. The method of claim 1, wherein the pre-generated USB request is configured to instruct the USB peripheral device to enable battery charging.

9. The method of claim 8, further comprising providing power to the USB peripheral device capable of charging a battery associated with the USB peripheral device.

10. A host device, comprising:
a memory configured to store a pre-generated Universal Serial Bus (USB) request, the pre-generated USB request associated with a functional characteristic of a USB peripheral device, the pre-generated USB-request pre-generated according to functionality associated with a USB host, wherein the pre-generated USB request comprises a packet identifier, request data, and a cyclic redundancy check value; and
a processing unit to transfer the pre-generated USB request stored in the memory to the peripheral device in response to detecting a functional characteristic of the USB peripheral device corresponding to the request data of the pre-generated USB request.

11. The device of claim 10, further comprising the memory configured to store a pre-generated acknowledgment packet that corresponds to the pre-generated USB request; a USB interface to receive a response to the transferred pre-generated USB request from the USB peripheral device, and to automatically send the acknowledgment packet to the USB peripheral responsive only to receiving the response from the USB peripheral device, and prior to a determination of whether the response was correctly received without error.

12. The device of claim 11, wherein the processing unit is configured to:
store the response received from the USB peripheral device to the memory;
parse the response stored to the memory to identify USB data requested in the pre-generated USB request; and
after the USB interface has sent the acknowledge packet, determine whether the response was correctly received without error.

13. The device of claim 11, further comprising an over-sampling data recovery circuit to receive the response from the USB peripheral device, the over-sampling data recovery circuit to recover the response by oversampling to provide a recovered response, wherein the processing unit is configured to store the recovered response to the memory.

14. The device of claim 10, wherein the processing unit comprises a direct memory access controller to transfer the pre-generated USB request stored in the memory to the USB peripheral device by performing one or more direct memory access operations.

15. A system comprising:
means for storing a pre-generated Universal Serial Bus (USB) request produced in a format allowing a USB host to transfer the pre-generated USB request to a USB peripheral device, the pre-generated USB request being pre-generated according to functionality associated with the USB host and a USB peripheral device, wherein the pre-generated USB request including a packet identifier, request data, and a cyclic redundancy check value; and
means for thereafter detecting a functional characteristic of the USB peripheral device corresponding to the request data of the pre-generated USB request; and
means for transferring, in response to detecting the USB peripheral device, the stored pre-generated USB request to the USB peripheral device over a USB.

16. The system of claim 15, further comprising:
means for storing a pre-generated acknowledgment packet that corresponds to the pre-generated USB request;
means for receiving a response to the transferred pre-generated USB request from the USB peripheral device over the USB; and
means for automatically sending the acknowledgment packet to the USB peripheral device over the USB responsive only to receiving the response from the USB peripheral device.

17. The system of claim 16, further comprising means for parsing the response from the USB peripheral device, and means for automatically sending the acknowledgment packet to the USB peripheral device over the USB prior to parsing.

18. The system of claim 16, further comprising means for performing one or more direct memory access operations to directly transfer the response to the memory.

19. The system of claim 16, further comprising:
means for recovering the received response by oversampling a received version of the received response; and
means for storing a recovered version of the response to the memory.

20. The device of claim 15, wherein the pre-generated USB request is configured to instruct the USB peripheral device to enable battery charging.

21. The method of claim 4, further comprising determining whether the response to the pre-generated USB request was correctly received without error after the automatic sending step.

22. The device of claim 11, wherein USB interface to receive a response to the transferred pre-generated USB request from the USB peripheral device over the universal serial bus is configured to determine whether the response to the at least one pre-generated USB request was correctly received without error after the automatic sending step.

* * * * *